(12) United States Patent
Schalansky

(10) Patent No.: US 6,511,759 B1
(45) Date of Patent: Jan. 28, 2003

(54) MEANS AND METHOD FOR PRODUCING MULTI-ELEMENT LAMINAR STRUCTURES

(76) Inventor: Carl Schalansky, 4261 Power Inn Rd., Sacramento, CA (US) 95826-4336

(*) Notice: Subject to any disclaimer, the term of this patent is extended or adjusted under 35 U.S.C. 154(b) by 0 days.

(21) Appl. No.: 09/498,868

(22) Filed: Feb. 7, 2000

(51) Int. Cl.[7] .......................... B32B 15/01; B23K 1/00; B23K 20/14; H01L 29/02

(52) U.S. Cl. ...................... 428/576; 428/594; 428/603; 428/616; 428/620; 428/635; 228/137; 228/186

(58) Field of Search .................................. 428/576, 594, 428/603, 616, 620, 635; 228/137, 186

(56) References Cited

U.S. PATENT DOCUMENTS

| | | | | |
|---|---|---|---|---|
| 4,029,254 A | * | 6/1977 | Blair et al. | |
| 4,359,181 A | * | 11/1982 | Chisholm | |
| 4,592,415 A | * | 6/1986 | Friedman | |
| 5,118,026 A | * | 6/1992 | Stacher | |
| 5,192,623 A | * | 3/1993 | Gewelber | |
| 5,242,016 A | * | 9/1993 | Voss et al. | |
| 5,420,400 A | * | 5/1995 | Matsen | |
| 6,184,476 B1 | | 2/2001 | Takashi et al. | |
| 6,389,686 B2 | | 5/2002 | Takashi et al. | |

* cited by examiner

Primary Examiner—Deborah Jones
Assistant Examiner—Jason Savage
(74) Attorney, Agent, or Firm—McHale & Slavin, P.A.

(57) ABSTRACT

The instant invention provides a means and method for producing multi-laminar elements, said elements being suitable for operation in high temperature, atmospheric or vacuum environments such as those which may be required when processing materials such as substrates for semiconductors or for chemical vapor deposition.

21 Claims, 10 Drawing Sheets

MEANS AND METHOD FOR PRODUCING MULTI-ELEMENT LAMINAR STRUCTURES

FIELD OF THE INVENTION

This invention is directed to the field of materials fabrication and specifically, to the field of materials fabrication involving the joining of materials through the use of controlled atmosphere bonding.

BACKGROUND OF THE INVENTION

One of the most significant inventions of the twentieth century is that of the microprocessor. The ability to provide intelligence on a chip has fostered countless products ranging from cellular telephones to portable life support systems to hand held video games. While the processing ability of these computers on a chip has increased dramatically since their introduction, perhaps even more significant is the fact that as the power of these chips has continued to increase, the cost of these devices has decreased. Indeed, the processing power which once would have cost hundreds of thousands of dollars can now be purchased for just a few dollars. Because of their favorable cost to performance ratio, microprocessors are now nearly ubiquitous in most developed countries. As in most areas of technology, the companion technologies which must be employed to produce these devices such as the microprocessor have advanced as well.

Because of the complexity and high density of electronic components in these devices, coupled with the fine geometries at which they must be fabricated, it is not surprising that their production processes must be carefully controlled. By carefully controlling each step of the complex manufacturing processes, engineers have been able to continuously improve the state of the art, thereby providing dramatic improvements not only in the function of the devices being produced but also in the yield of the processes used to produce these devices. The processes of Chemical Vapor Deposition (CVD) and Physical Vapor Deposition (PVD) are frequently employed to produce exotic or difficult to create materials on substrates. Many semiconductor fabrication processes such as chemical vapor deposition require that the substrate on which materials are to be deposited be first thoroughly cleaned and subsequently heated prior to and during the actual deposition process. The heating process must be controlled precisely since variations in temperature of the substrate can result in variations of the properties of the thin films to be deposited or, indeed whether deposition occurs in the first place. Additionally, if the substrate is not heated and ultimately, cooled evenly and in a precise manner, warping may occur which can result in permanent deformation of the substrate, rendering it unsuitable for the intended purpose.

A variety of means may be employed in the heating of materials such as substrates. Firstly, if the substrate is electrically conductive, it may be directly heated. An electric current may be passed through the substrate thereby causing it to be heated proportionately to the voltage presented to and current passing through the substrate. Many of the materials used for fabrication of micro sensors and integrated circuits for example, are glasses, ceramics or, in the case of semiconductors, silicones. These materials are at best, poor electrical conductors so this heating means is seldom employed when processing these materials.

A heated plasma or an energy beam such as a laser or electron beam may be used to heat the object. These processes are unfortunately, rather complicated and quite costly. Additionally it is difficult to control these energy sources in a manner which will promote even heating of the entire object to be heated. Further, the energy fields induced in the substrate by these methods may damage the substrate or coatings or circuit elements (if any) thereon.

A conductive heating process may be employed which involves placing the item to be heated directly on a heated plate whereby heat is transferred from the heated plate to the object to be heated. Traditional hot plate systems are however, notorious for being anisothermal, thereby creating hot spots in the object being heated which can lead to mechanical deformation or to other process failure.

Conductive heating may also be accomplished by using a suitable gas to transfer heat from a heat source to the object to be heated. Ovens using this process are often referred to as atmospheric ovens and may employ inert, oxidizing or reducing atmospheres as may be beneficial to the process. Mechanically stirring the heated gas serves to make this type of heating process more or less isothermal and minimizes temperature variations which may be induced by thermal convection or through the use of more or less point source heaters. This process is of course not possible in the event that the object to be heated must be processed in a vacuum. Since chemical vapor deposition often takes place at reduced pressures of for example, in the range of 0.1 torr 1 atmosphere, the process of conductive heating employing gasses may not be practical in some of these applications.

Radiative heating may be used to heat the object whereby infrared energy is transferred by radiation from a heated source to the object, whether the object is in vacuum or in an atmosphere. Radiative heating offers an advantage over direct conductive heating in that the object to be heated need not be in contact with the heat source. Eliminating this contact also eliminates surface defects on the object to be heated which can be created when contaminants on the heat source are transferred to the object to be heated. Additionally, if temperatures and contact forces between the heat source and the object to be heated are sufficiently high, diffusion bonding or welding may occur, thereby bonding the object which is to be heated to the heat source and potentially ruining the process part. Ideally, a highly emissive, heated, isothermal plate is used as a radiation source to transfer heat to the object to be heated. Desirable qualities of this plate include flatness and the ability to accurately control thermal radiation from the surface of the plate. The task of producing the desired radiation source which is capable of providing a nearly constant thermal emission over the entire surface is formidable. This task is further complicated when the object and hence, the required radiating plate are of significant size. Additionally, some means for precisely heating and preferably also, cooling the plate must be accomplished. These same critical issues also apply to the previously described process of conductive heating. Copper for example, exhibits a high degree of thermal conductivity but relatively low resistance to bending moments, particularly at elevated temperatures. Additionally, copper is a relatively active metal which may interact negatively with other materials in the process and/or contaminate the operating environment. Stainless steels offer mechanical strength and are relatively inert, but exhibit poor thermal conductivity. Both copper and stainless steel have relatively low emissivity in their natural state, making them inefficient radiators of thermal energy. It can be seen then, that using either of these materials alone fails to provide for an effective heat source for either radiative or conductive heating of planar materials.

U.S. Pat. No. 5,192,623 discloses laminated structural panels and a method of producing them. This patent teaches to the production of structural panels in which at least one of the panel members is perforated so that when laminated between two imperforate panels and brazed in a high vacuum environment, that a substantial vacuum will be formed and maintained between the imperforate panels in the void space created between the panels and the perforations in said perforated plate. Such a panel containing these vacuum pockets is useful as an insulator of temperature and sound. As such, the panel described in U.S. Pat. No. 5,192,623 would not be suitable as a source of isothermal radiation, nor cooling, nor fluid transport.

U.S. Pat. No. 4,359,181 provides for a dip brazed, laminated heat transfer surface. This patent discloses a process to produce an improved fluid to fluid heat exchanger through the use of laminated expanded metal members. No claim is made with respect to using this invention as a source of isothermal radiation or conductive heating.

A relatively common type of heat exchanger is described in U.S. Pat. No. 4,592,415. The thin, heat exchanger produced by the process of U.S. Pat. No. 4,592,415 comprises two photochemically etched plates which are sealingly joined together so that a fluid passage is created between said plates. The process is not well suited to the production of relatively large planar members which require a high degree of stiffness and flatness.

A laminated plate header for a refrigeration system and method for making same is taught in U.S. Pat. No. 5,242,016. This invention is intended to selectively distribute refrigerant from a header inlet to a heat exchanger. Brazing is mentioned as a possible means of assembling the various components which comprise the system. The device of this invention is directed only at refrigeration systems and particularly, at the distribution of refrigerant to the core units of a heat exchanger. No mention of use as a flat, heated panel is made.

U.S. Pat. No. 4,029,254 describes a method of diffusion bonding and brazing of materials as may be used to produce jet engine housing ducts. The method described uses a process whereby the materials to be joined are placed more or less coaxially inside of a cylindrical container. A male plug is inserted through the center of the innermost member to be joined, which plug has a coefficient of thermal expansion which is greater than the material it faces and the core material. As the entire assembly is heated, this differential rate of thermal expansion causes the male plug to exert force against the interior of the assembly so that intimate contact between the parts to be joined may be achieved. An arrangement of ceramic or other pellets controls the ultimate forces holding the parts together during the brazing or diffusion process. The process claims are limited to the use of honeycomb core materials and no mention is made of using the means of this invention to produce flat, radiative panels, or cooling, chucks, or fluid transmission.

A process for simultaneously forming and brazing of titanium or aluminum components is taught in U.S. Pat. No. 5,821,506. The method described in this invention provides for an inductively heated thermal process which first forms metal parts through superplastic deformation and then, in the same process, brazes these parts in a retort. The interior faces of the retort are coated with a release agent, such as boron nitride so that the retort does not become bonded to the parts being processed. After the process is completed, the retort is cut away. The process is directed at the production of structural aerospace assemblies.

Similarly, U.S. Pat. No. 5,420,400 teaches a sequential process of forming and brazing using a disposable retort. A combined cycle for forming, annealing, (particularly annealing of titanium) and brazing is described in U.S. Pat. No. 5,914,064. Induction heating through ceramic dies provides for an efficient heat transfer process, however, the retort used in the process described in this patent is deliberately not bonded to the parts to be processed and the retort is completely discarded from the part after processing. Additionally, there is no teaching to the desirable formation of an oxide layer to enhance thermal radiation by increased surface emissivity or even to the use of the formed part to serve as a heating or cooling member.

A method specific to making titanium aluminide metallic sandwich structures is described in U.S. Pat. No. 5,118,026. A diffusion bonding process is combined with a superplastic forming process in order that sandwich structures of definite geometry may be constructed. A disposable retort is used here to maintain an oxygen and contaminant-free environment in order that diffusion bonding may take place. Once again, this patent teaches to the fabrication of a structural member without mention of use of such member as a device to be used to impart heating or cooling to other objects. Additionally, there is no mention of the desirable formation of an oxide layer, in fact the text teaches away from the formation of oxides.

What is lacking therefore is a means to fabricate a system whereby objects such as, for example, semiconductor materials or CVD substrates can be heated in a precisely controlled process, whether that process takes place in an atmosphere or vacuum. Imperative in the design of such a system is high thermal conductivity in the heated plate, high resistance to bending moments in the heated plate and high emissivity on the surface of the heated plate. Additionally, it may be desirable that the system offer the capability of rapid cooling, since many processes require accelerated cooling to quench or otherwise thermally process the materials being produced. Gas transmission capability is also desirable for use as a heated chuck.

If a means could be devised to produce planar elements which possessed the desired qualities previously discussed, it would greatly enhance the ability to thermally process materials whether that process occurred in vacuum or in an atmosphere. Said means would be invaluable for the production of equipment to be used in the precise thermal processing of for example, sheets of glass or semiconductor substrates. Such a system could of course also be used to produce planar or other forms of elements which would undoubtedly find application in for example, chemical or biological material processing. The instant invention then provides for a means and economical process to produce a multi-laminar element which has high thermal conductivity throughout its planar surface, is robust and resistant to flexure or bending, has a high degree of flatness over its surface as may be desired, exhibits high surface emissivity, is essentially inert with respect to corrosive environments and may be precisely heated and cooled thereby permitting the plate to cause heating and cooling in other materials which may be in contact with or proximal to said element.

SUMMARY OF THE INVENTION

The instant invention provides for a means and process to produce a high compliance multi-laminar element or structure which finds application in the processing of materials such as semiconductor substrates, or chemical or biological materials.

Further, it is an object of this invention to provide for a means of producing multi-laminar elements which exhibit high thermal conductivity.

Still another object of the instant invention is to provide for a means to produce multi-laminar elements which have surfaces exhibiting high thermal emissivity.

It is a further object of this invention to disclose a means which may be employed to produce multi-laminar elements which are highly resistant to flexure and bending moments.

Yet another object of the instant invention is to provide for a process which may be used to produce multi-laminar elements which may be heated by means of internal electric heating elements.

Yet still another objective of this invention is to provide for a system which permits the production of multi-laminar elements which may be heated and/or cooled through the use of hot or cold gasses or other fluids which may traverse passages within said planar elements.

Additionally it is an object of the instant invention to provide for a means to produce multi-laminar elements which are relatively chemically inert as may be required in the processing of semiconductor and similar materials.

Another object of this invention is to provide for a means by which materials may be joined whereby a portion of said materials interact with a differential gas pressure thereby creating a condition of dynamic loading to enhance the joining process.

Still another object of the instant invention is to teach a means whereby, multi-laminar elements may be produced, said elements having a high degree of flatness.

Another object of this invention is to provide for a means whereby a very high degree of thermal conductivity may be achieved between two planar materials which are brazed together.

Further, it is an object of this invention to provide for a means whereby the process of transient liquid phase diffusion bonding is employed to assemble components of multi-laminar systems.

Still further, it is an object of this invention to provide for a means whereby the process of diffusion bonding known as transient liquid phase diffusion bonding is employed to assemble components of multi-laminar systems.

Yet another object of this invention is to provide a means to mark and henceforth precisely identify hidden positional reference points so that precise automated machining processes may be accomplished.

Another object of the instant invention is to provide for a means of dynamic loading of a plurality of materials whereby members using in the loading process become a useful part of the finished assembly.

Yet still another object of this invention is to provide for a process whereby the emissivity of an object may be beneficially enhanced while simultaneously joining materials.

Further, it is an object of this invention to provide for an efficient means whereby elements may be precisely aligned and protected during a bonding process.

Still another object of the instant invention is to provide a means of economically joining materials.

It is a further object of this invention to provide a process which is economical in that said process combines several processing steps into one-operation.

It is a further object of this invention to provide a process which is economical in that said process utilizes relatively inexpensive brazing alloys.

Yet still another object of this invention is to provide for a process whereby the required quantity of braze alloy for any given brazing operation is minimized by controlling flow of said alloy and thereby promoting its efficient use.

Further, it is an object of the instant invention to provide for a method of integral containment which produces minimal contaminants to the brazing furnace by the process of the instant invention.

Yet further, it is an object of this invention to provide for a single process whereby the dynamic loading, bonding, control of alloy flow and formation of a desirable oxide surface layer, or alternately, an ultra clean surface may be accomplished simultaneously.

Additionally it is an object of this invention to provide for a process of bonding components whereby said components may be formed either prior to or after said bonding operation.

Still another object of the instant invention is to provide for a bonding process whereby a high vacuum source is advantageously distributed about the periphery of a centrally located core plate.

Other objectives and advantages of this invention will become apparent from the accompanying descriptions taken in conjunction with the accompanying drawings wherein set forth, by way of illustration and example, are certain embodiments of this invention. The drawings constitute a part of this specification and include exemplary embodiments of the present invention and illustrate various objects and features thereof. It will be readily appreciated by those skilled in the art that the use of the process described in the instant invention is highly effective and useful.

DETAILED DISCLOSURE OF THE INVENTION

As required, detailed embodiments of the instant invention are disclosed herein, however, it is to be understood that the disclosed embodiments are merely exemplary of the invention which may be embodied in various forms. Therefore, specific functional and structural details disclosed herein are not to be interpreted as limiting, but merely as a basis for the claims and as a representative basis for teaching one skilled in the art to variously employ the present invention in virtually any appropriately detailed structure.

Figure 1:
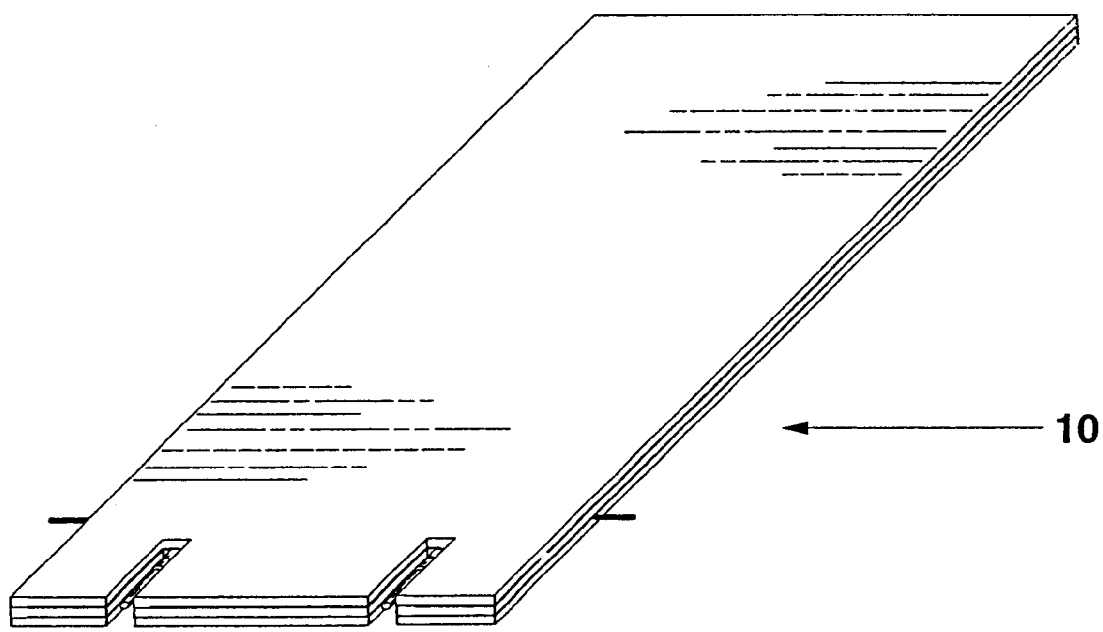
FIG. 1 is an isometric view of a multi-laminar element.
Figure 2:
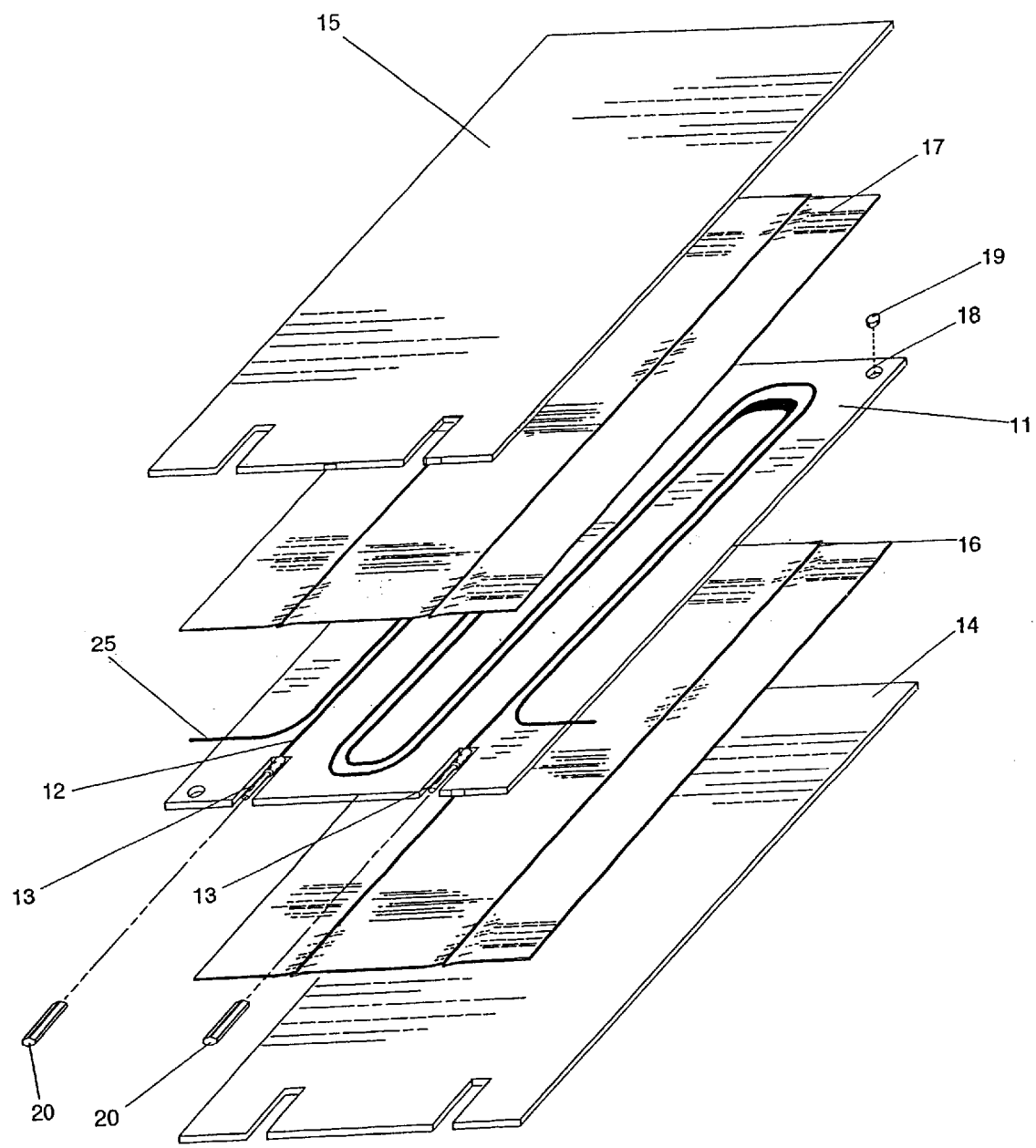
FIG. 2 is an exploded isometric view of a multi-laminar element.
Figure 3A:
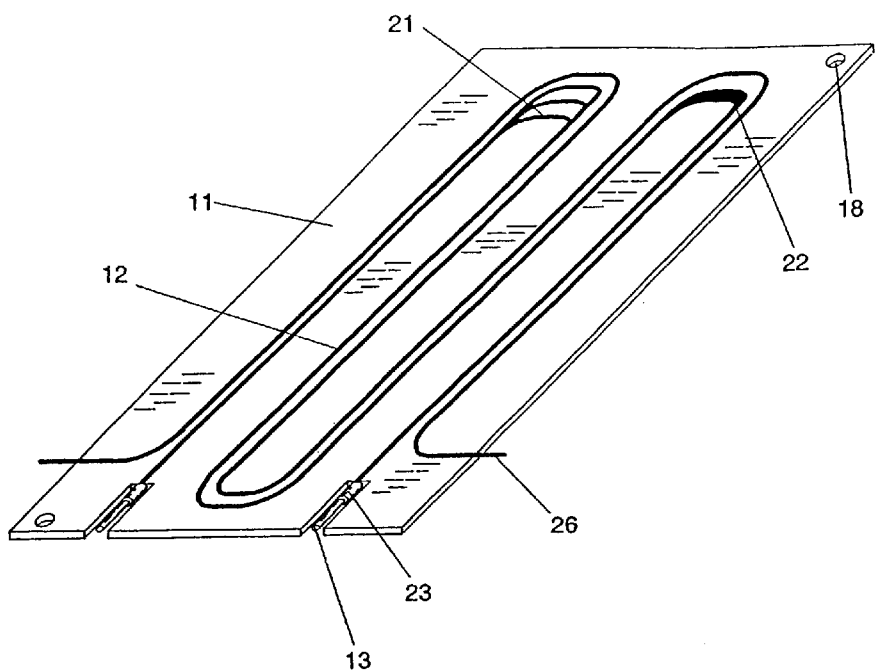
FIG. 3A is an isometric view of a core construction showing an electric heating element.
Figure 3B:
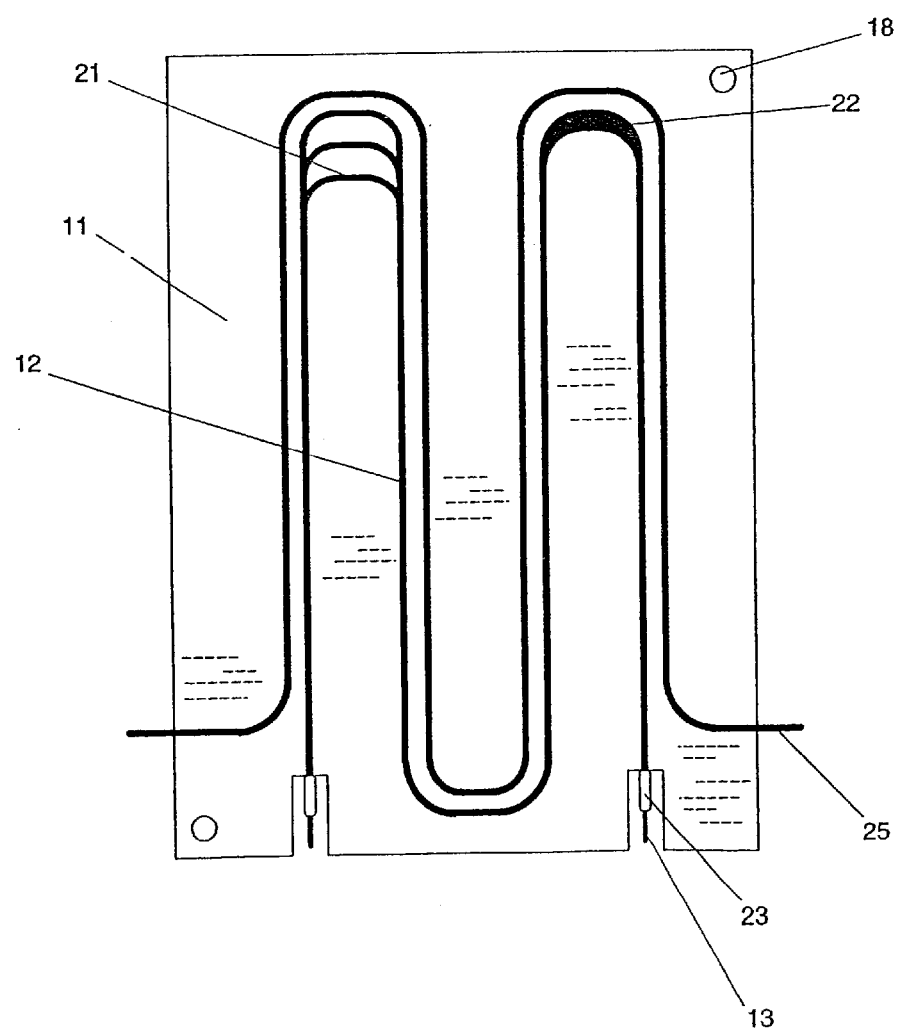
FIG. 3B is a plan view of a core construction showing an electric heating element.
Figure 3C:
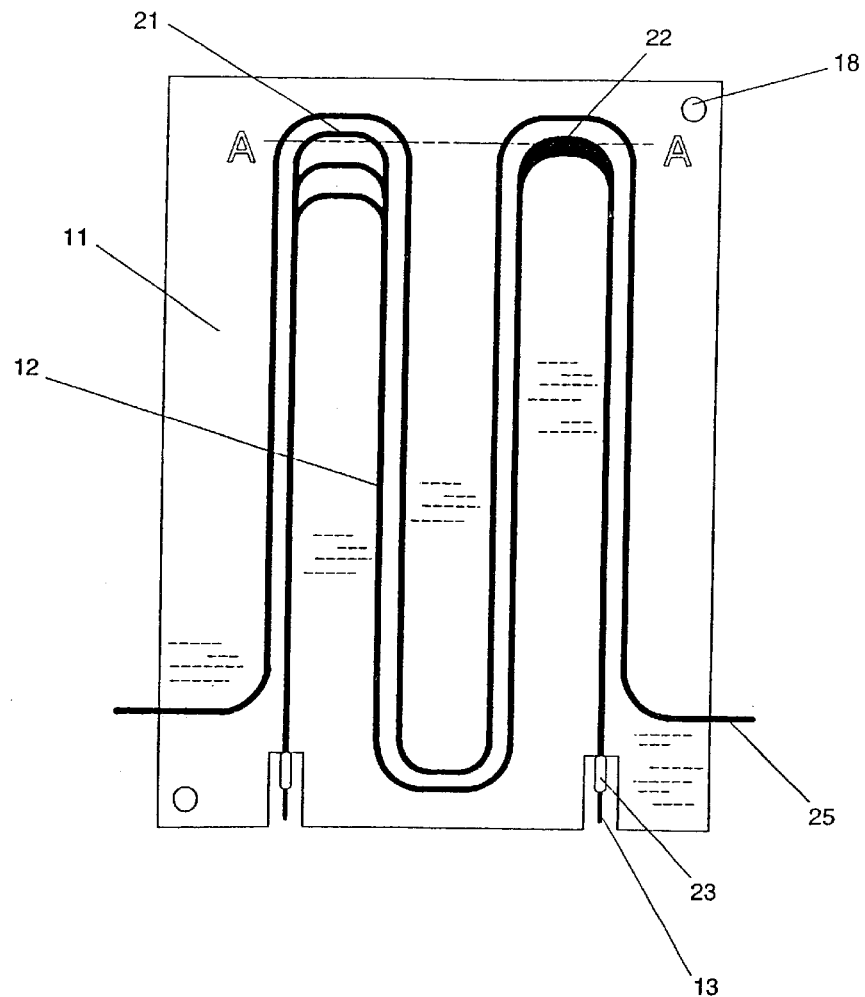
FIG. 3C is a plan view of a core plate showing an electric heating element and section line A—A.
Figure 3D:
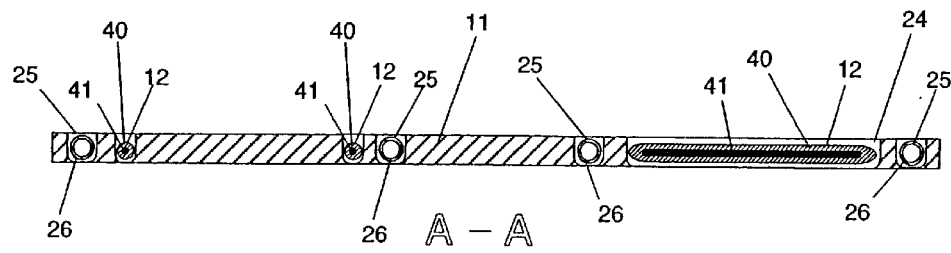
FIG. 3D is a section view of a core construction showing location of an electric heating element prior to brazing.
Figure 3E:
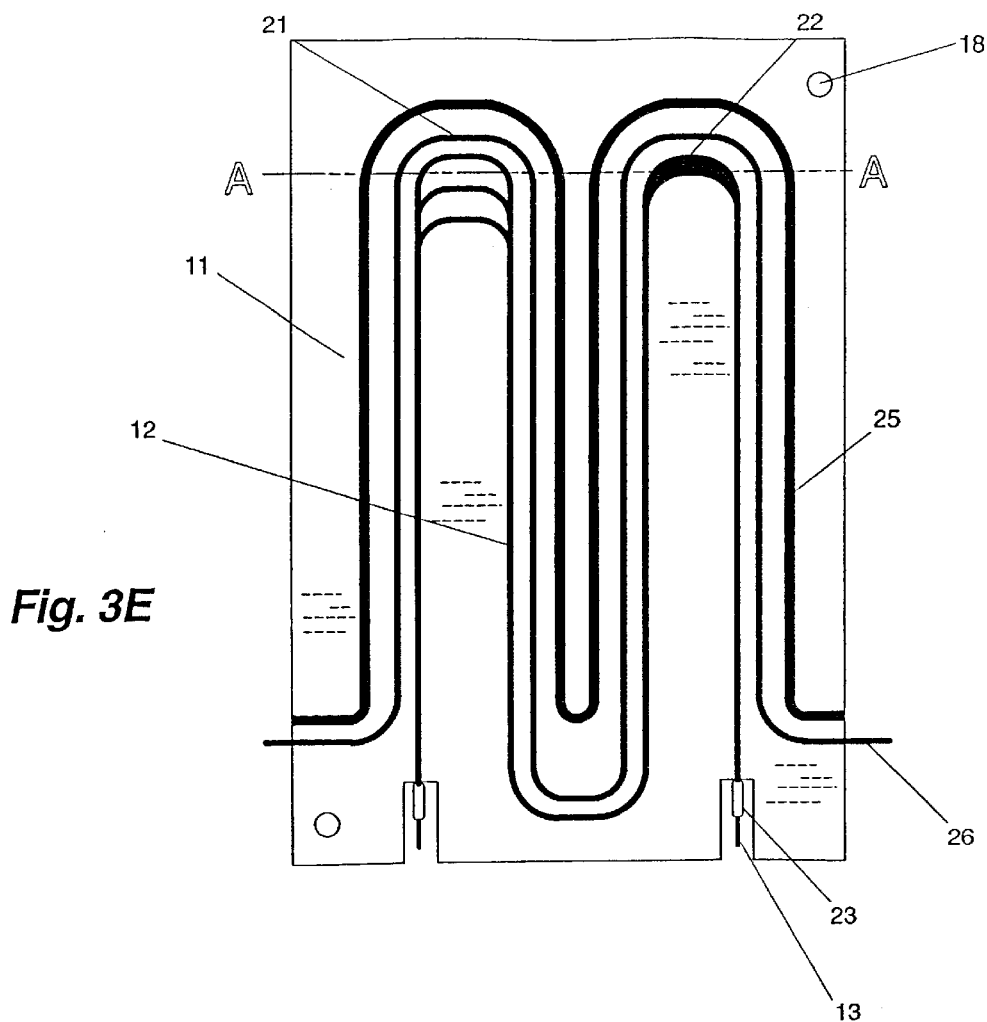
FIG. 3E is a plan view of a core plate showing an electric heating element, brazed tube fluid channel, open fluid channel and section line A—A.
Figure 3F:
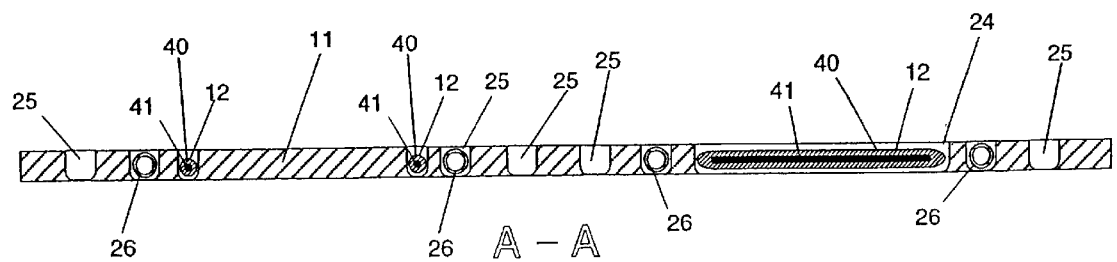
FIG. 3F is a section view of a core plate showing location of an electric heating element, brazed tube fluid channel and open fluid channel prior to brazing.

Now with general reference to the drawings and, in particular to FIG. 1, the completed multi-laminar element, 10 of the instant invention is shown. Referring to FIGS. 2, 3A, 3B, 3C and 3D, (FIGS. 3E and 3F are similar to FIGS. 3C and 3D but include a channel allowing perforations as further defined in reference to FIG. 7) one embodiment of the instant invention is comprised of a laminate of various materials and components such as may be desired to produce an electrically heated plate. Said plate having a high degree of flatness over its surface and a high resistance to bending. A core plate, 11 is provided with machined passages such that electric heating element, 12 may be located in said passages and thereby entirely contained between the exterior planar surfaces of core plate, 11. Sufficient space is provided between electric heating element, 12 and the machined passage so as to permit a portion of second alloy preform, 17, when in a liquidus state, to flow into said passage and completely around heating element, 12, thereby enhancing thermal conductivity between heating element, 12 and core plate, 11. Coarse adjustment channels, 21 permit integral adjustment of the effective passage length to more precisely match that of electric heating element, 12. Electric heating element, 12 is comprised of an outer sheath, and electric heater conductor, 41 which are coaxially separated by electric heater insulation, 40. Electric heating element, 12 is placed in the machined passage with a segment of heating element, 12, being placed in that single coarse adjustment channel, 21 which most closely permits cold pins, 13 to be properly positioned in core plate, 11. Fine adjustment of the position of cold pins, 13 is accomplished by permitting any extra slack in electric heating element, 12 to reside in fine adjustment channel, 22. After electric heating element, 12 is properly positioned in the machined passage, metal filler pieces are fitted to the unused coarse adjustment channels, 21 and any extra space remaining in fine adjustment channel, 22. Electric heating element, 12 may be temporarily retained within the machined passage by using a small center punch to peen a portion of the passage sidewall over electric heating element, 12 at various locations. Positioning of electric heating element, 12 so that it is situated as nearly as possible, mid way between the faces of core plate, 11 promotes symmetrical heating of core plate, 11 with respect to said faces. If an overriding reason does not prevent electric heating element, 12 from being located at or near the center plane between the faces of core plate, 11 it is therefore desirable to do so since asymmetrical heating could induce differential stresses in core plate, 11, thereby resulting in bending or warping of the assembly.

At least one locator hole, 18 is provided to receive locator pin, 19. Locator pin, 19 serves to provide a precise, reference for subsequent machining operations. Locator pin, 19 may be fabricated from graphite, machinable ceramic or any other suitable material so long as it does not interfere with the brazing process or other subsequent operations. More information will be provided as to the function of locator pin, 19 later. As can be seen in FIG. 2, alignment/protector sleeves, 20 are provided. These sleeves have a blind hole (not shown) which permits them to slip over cold pins, 13 thereby protecting the pins from contact with molten alloy during the subsequent brazing process. Additionally, alignment/protector sleeves, 20 provide for precise alignment of cold pins, 13 with respect to core plate, 11. Alignment/protector sleeves, 20 are specially shaped, having reduced cross section in those regions proximal to core plate, 11. Said reduced cross section permits first and second outer plates, 14 and 15 respectively to come into intimate contact with core plate, 11, save that space occupied by molten braze alloy during the brazing process. If alignment/protector sleeves, 20 were not shaped as described, first and second outer plates, 14 and 15 respectively may be held away from core plate, 11 and hence, not capable of being completely brazed to core plate, 11. Complete bonding is necessary to ensure good thermal conductivity and structural strength between core plate, 11 and first and second outer plates, 14 and 15 respectively. Additionally, if voids were permitted between first and second outer plates, 14 and 15 respectively and core plate, 11, "virtual leaks" could be produced which could prevent multi-laminar element, 10 from being effectively used in high vacuum environments. Insulator sleeves, 23 may be installed over cold pins, 13 as may be desired either before or after the brazing process and may be joined to electric heating element, 12 as desired by brazing or other suitable means. Insulator sleeves, 23 may be fabricated from graphite or any other suitable material so long as it does not interfere with the brazing process or other subsequent operations. If electric heating element, 12 is comprised of electric heater insulation, 40 which is porous or otherwise hygroscopic, it may be desirable to apply electric power to electric heater conductor, 41 thereby causing localized heating and hence, driving off any moisture in electric heater insulation, 40 prior to joining insulator sleeves, 23 to electric heating element, 12. If a high degree of thermal conductivity is desired in the object produced by the process of the instant invention, oxygen free, high conductivity copper, for example may be used in its construction. Cold pins, 13 permit electrical power to be applied to electric heating element, 12 when the completed product is to be operated. Core plate, 11 is sandwiched between first outer plate, 14 and second outer plate, 15. Said outer plates will be bonded to core plate, 11 over substantially the entire planar surfaces of core plate, 11, thereby providing an assembly with greatly increased resistance to bending moments as compared to the bending resistance of core plate, 11 by itself. If overall strength and relative chemical inertness of multi-laminar element, 10 is desirable, then first outer plate, 14 and second outer plate, 15 may be produced from of a variety of stainless steels, aluminum or other suitable materials. A first alloy preform, 16 and a second alloy preform, 17 are placed between core plate, 11 and first outer plate, 14 and second outer plate, 15 respectively. Said alloy preforms being suitable for joining by the process of furnace brazing of core plate, 11 to first outer plate, 14 and also to second outer plate, 15. This bonding process is critical and fundamental to the instant invention. If for example, core plate, 11 was fabricated of oxygen free high conductivity copper and first outer plate, 14 and second outer plate, 15 were fabricated from, for example, 304 stainless steel, traditional furnace brazing processes would call for a brazing alloy such as Palcusil-15®, said brazing alloy being manufactured by Wesgo®, division of The Morgan Crucible Company plc. This alloy is comprised of 65% silver, 20% copper and 15% palladium. It is well suited to joining copper and stainless steel by brazing. However, since this alloy contains palladium, its cost is extremely high. In addition to its high cost, this material is often difficult to source since palladium can be obtained from only a few sites in the entire world. The presence of an oxide layer, chromium oxide for example, on the surface of the aforementioned stainless steel, precludes good wetting action on the stainless steel by more common and less expensive alloys such as Cusil®, Nicusil-3 ® or Nicusil-8®. If though, the surface of the stainless steel is extremely clean and the partial pressure of oxygen and water vapor present is extremely low, it is possible to promote good wetting on materials, for example 304 stainless steel which is normally, virtually impossible to braze with alloys such as Cusil or Nicusil-3. However, this desired brazing action can only take place at temperatures which are significantly higher than the normal brazing temperatures of alloys such as Cusil, or Nicusil-3-8. At these greatly elevated temperatures, the aforementioned alloys exhibit very low viscosity and their flow is difficult to control, often resulting in alloy which fails to fill gaps or voids as desired and which may flow into regions where the alloy is not desired. Additionally, at these elevated temperatures there is significant detrimental dissolution and concomitant erosion of the for example, copper, parent material. The instant invention however, elegantly solves all of the above problems. First, the evacuated envelope formed by first outer plate, 14 and second outer plate, 15 permit the brazing process to be carried out elevated temperatures in an atmosphere with extremely low partial pressures of oxygen. Second, the aforementioned envelope physically forces the alloy to be contained to those areas where brazing is desired.

Therefore, by use of the instant invention, one can advantageously employ much less costly alloys, e.g. alloys selected from the group consisting of powdered metal alloys, binary alloys, ternary alloys, silver/copper eutectic alloys, and nickel/phosphorus eutectic alloys. Some specific examples of useful alloys are Silver based, Nickel based and Gold based alloys, Cusil (72% silver, 28% copper), Nicusil-3 (71% silver, 28% copper, 1% nickel) or Nicusil-8 (56% silver, 42% copper, 2% nickel), also manufactured by Wesgo, to join dissimilar materials such as copper and stainless steel, as may comprise multi-laminar element, 10. Since most of these brazing alloys are only available in relatively narrow, thin strips, it may be desirable to combine these strips into a large single sheet so that larger surface areas may be brazed simultaneously. FIG. 2 illustrates how a plurality of these strips may be joined together, for example, by first overlapping and then spot welding said strips, to form large sheets such as first alloy preform, 16 and second alloy preform, 17. Spot welding these strips together not only facilitates handling and placement but also minimizes unintentional movement of these strips prior to the brazing operation. The braze alloy sheet may also be tack welded or spot welded to either core plate, 11 or alternatively, outer plates, 14 or 15 prior to assembly and brazing. The braze alloy may alternately be attached to core plate, 11 or to one of the outer plates 14 or 15 through the use of a cyanoacrylate adhesive commonly referred to as "super glue". The cyanoacrylate adhesive provides sufficient bonding of the braze alloy prior to brazing whereupon the adhesive volatizes and is removed from the process by the vacuum pumping system. The aforementioned brazing alloys are designed to function when used in reducing atmospheres or alternately, under high vacuum to prevent oxidation. This means that parts to be brazed using these alloys must be placed in a controlled atmosphere furnace or otherwise protected from oxygen and other contaminants during the brazing process. First alloy preform, 16 and second alloy preform, 17 may alternately be replaced by thin layers of nickel phosphorus which may be deposited by an electroless plating process on to surfaces of core plate, 11 where said surfaces abut the outer plates, or alternately, onto the inside or core construction abutting surfaces of first and second outer plates, 14 and 15 respectively, whereby said plating functions as the braze alloy. Similarly, pure nickel may be plated onto outer plates, 14 and 15, thereby permitting the relatively inexpensive braze alloy Cusil to be used. If core plate, 11 is to be copper, then core plate, 11 may be plated with silver which will form a copper/silver eutectic alloy upon heating and which may be used in place of a filler alloy. However, all of the plating processes described above are relatively expensive and are less economical than the preferred process of using sheets of braze alloy as described herein. A braze alloy could be applied in the form of a paste, said paste typically consisting of powdered metal alloy mixed with a binder and vehicle. First outer plate, 14 and second outer plate, 15, may of course be comprised of materials other than 304 type stainless steel, for example aluminum, and may even be of a composite nature. Accordingly, the alloys required to bond these materials may also be other than those stated above.

Figure 4:
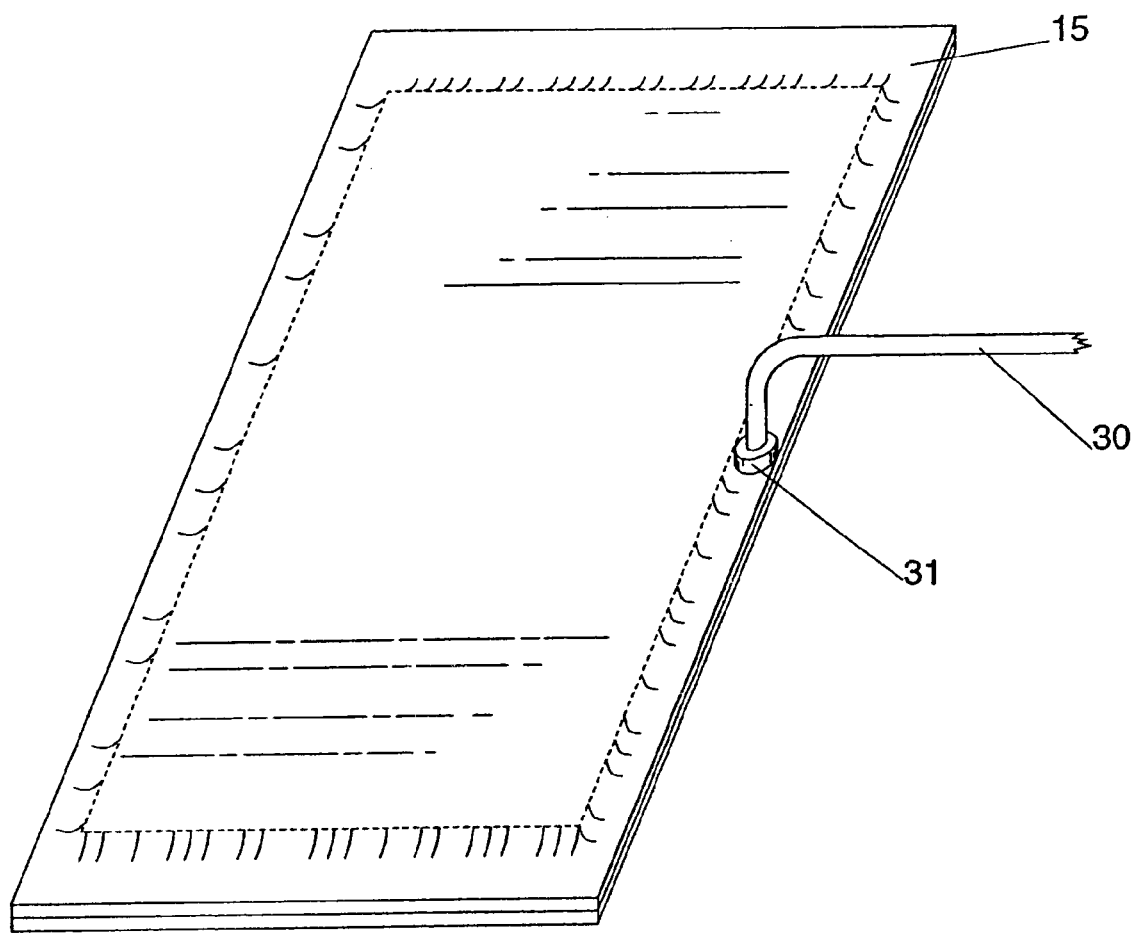
FIG. 4 is an isometric view of a multi-laminar element after processing and before post bonding machining.

A common problem encountered when attempting to braze objects such as may comprise the product of the instant invention in a controlled atmosphere furnace, and which have relatively large surface areas is that of applying sufficient loading to the surfaces to be joined. That is, the parts must be firmly held in place when the braze alloy is at liquidus. Additionally, the parts must be pressed together so that gaps or discontinuity between the surfaces to be bonded are minimized. Consider that one wishes to use steel weights to apply a loading force of, for example, 15 pounds per square inch to a plate to be brazed which is 24 inches by 24 inches square. The surface area of the plate is 576 square inches. To apply a loading force of 15 pounds per square inch to this plate would require a block of steel 24 inches square and approximately 45 inches high, weighing in excess of 8600 pounds. Safely handling such a weight in proximity to the relatively fragile parts to be brazed in itself poses a problem. Additionally, contact with such a block would almost certainly cause deformation and surface contamination of the parts to be bonded. Further, the useful heated area or "hot zone" of the furnace would be greatly diminished by the space required in the furnace for such a block. An elegant solution to this problem is presented in the instant invention. Now referring to FIGS. 4 and 6, if first outer plate, 14 and second outer plate, 15 are fabricated so that they are peripherally somewhat larger than core plate, 11, then said outer plates may be edge welded together to form a more or less, flat pouch, said pouch containing core plate, 11 with installed electric heating element, 12, said core plate being sandwiched between first and second alloy preforms, 16 and 17 respectively. A small hole is punched in one of said outer plates, e.g. in the second outer plate, 15, and in a particular embodiment located at an outer peripheral edge thereof, over which is attached evacuation tube, 30 by means of adapter ring, 31. An inert gas welding process may be used to join adapter ring, 31 to second outer plate, 15 and evacuation tube, 30 to adapter ring, 31. Standard fillet welds, 32 easily accomplish this. While not obvious in FIG. 4, evacuation tube, 30 is preferably located proximal to the location of cold pins, 13 since the primary sources of outgassing are electric heater insulation, 40 and pre-fired alignment/protector sleeves, 20. Additionally, it is imperative that the attachment location of evacuation tube, 30 to second outer plate, 15 be such that collapsing of the envelope formed by first outer plate, 14 and second outer plate, 15 does not result in inhibition of pumping through evacuation tube, 30 as may be caused by interaction of core plate, 11 with second outer plate, 15. A small perforated spacer could be positioned between second outer plate, 15 and core plate, 11 as may be desired to further prevent the aforementioned inhibition of flow.

Evacuation tube, 30 is connected to a vacuum pump whereby any atmosphere in the aforementioned pouch can be withdrawn. Application of vacuum to the inside of the pouch provides four important functions. First, as previously discussed, it is necessary to remove or otherwise displace oxygen and other contaminants from the components inside the pouch which are to be brazed. Pumping with a high vacuum pump accomplishes this. Second, withdrawing the atmosphere from the inside of the pouch permits first and second outer plates, 14 and 15 respectively to be pressed tightly against any elements contained between said outer plates providing however, that the exterior region of the pouch is not itself placed in a vacuum environment. This pressing effectively "loads" the parts thereby eliminating the previously described block of steel. Third, because this form of loading is dynamic, first and second outer plates, 14 and 15 are free to undergo some degree of pressure induced forming whereby these plates form tightly about any objects contained between them even if some irregularities are present. This is useful to promote a high degree of thermal conductivity between core plate, 11 and first and second outer plates, 14 and 15. Additionally, this forming action also permits excess molten braze alloy in one region to be forced into another region which might otherwise receive insufficient alloy. Further, this loading process promotes production of extremely flat planar elements when these elements are properly supported on a flat hearth. If yet a higher degree of loading than that produced by applying a vacuum to the inside of the pouch and letting atmospheric pressure act externally upon it is desired, additional force may also be applied by creating a positive pressure in the atmospheric furnace. For example, application of 30 PSIG gas pressure will yield a final net force acting on the outside of the pouch of almost 45 PSI. Lastly, application of vacuum to evacuation tube, 30 permits any surplus molten braze alloy to be contained and withdrawn from the furnace, avoiding possible contamination of the furnace. Proper brazing is not precluded even if a volume of surplus molten braze alloy should be drawn into evacuation tube, 30.

It is of course possible to apply the teachings of the instant invention in the fabrication of high compliance, multi-laminar elements which are other than flat multi-laminar elements. For example, a tube or other shape may be fabricated by a similar bonding process. Alternately, the previously described flat multi-laminar element may first be produced by the process of the instant invention and then formed into the desired shape.

Figure 5:
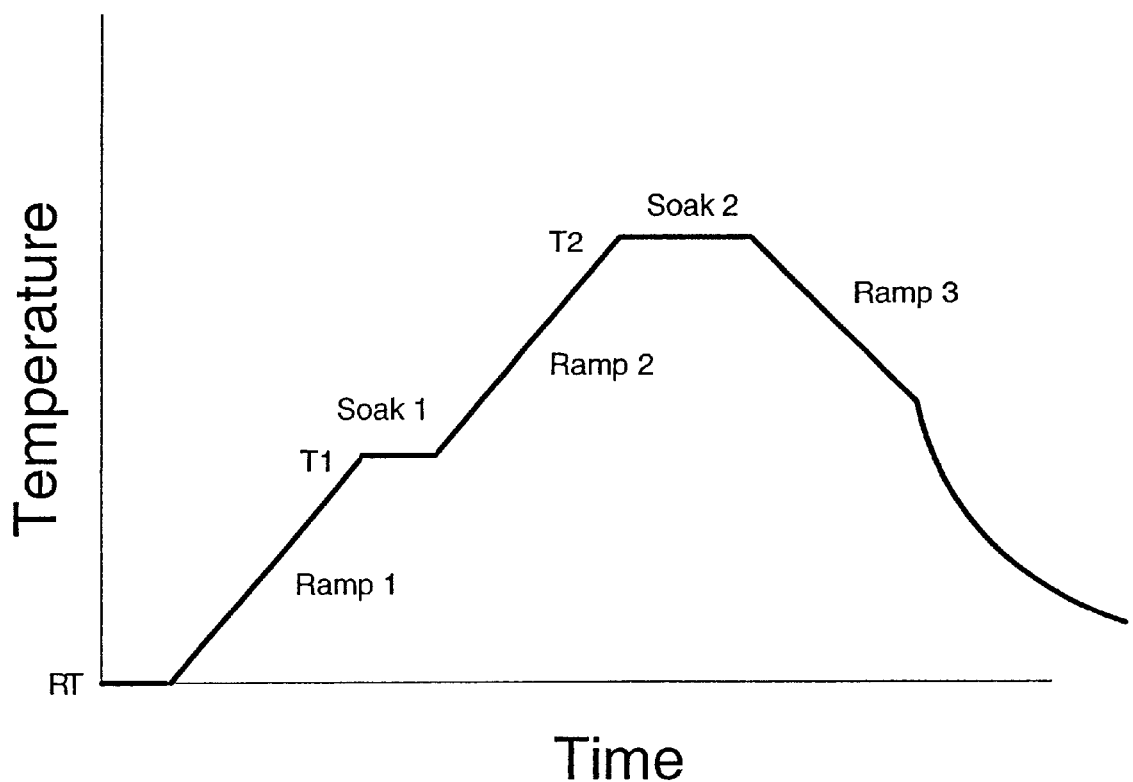
FIG. 5 is a time-temperature graph showing a thermal processing cycle.

To practice the process of the instant invention, only a single, thermal cycle is required. If Cusil®, for example, is to be used as the braze alloy to join a copper core plate, 11 to 304 type stainless steel first and second outer plates, 14 and 15 then the thermal processing cycle illustrated in FIG. 5 may be employed.

Figure 6:
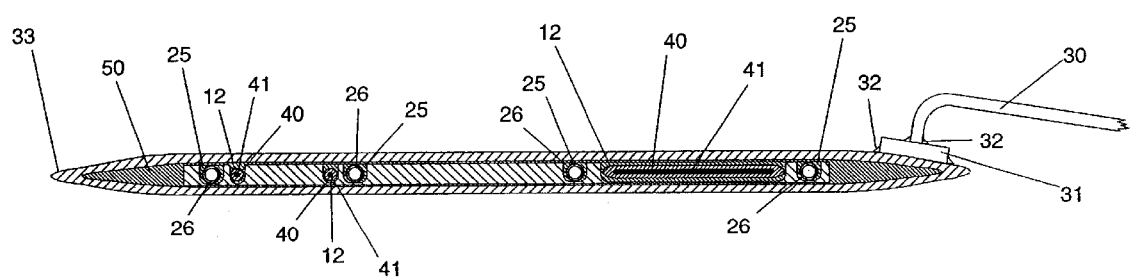
FIG. 6 is a section view of a multi-element assembly after brazing.

FIG. 6 shows a cross sectional view of the instant invention after brazing but before final machining. Braze alloy, 50 can be seen to have flowed completely around all materials contained in the aforementioned pouch, thereby producing a unitized assembly with a high degree of thermal conductivity between core plate, 11 and first and second outer plates, 14 and 15 and between core plate, 11 and electric heating element, 12. Additionally, a high degree of dimensional compliance and flatness is produced in the assembly. FIG. 6 also illustrates the inclusion of optional fluid channels, 25 through which channels may flow heating and or cooling fluids, or chuck power or reactant gasses as may be desired. In a particular embodiment, channels 25 may be in the form of perforations which allow for passage of the intake or effluent fluid stream as desired. Additionally these, or similar channels or a bonded tube, 26 may be used for the communication of liquids or, alternately, gasses such as helium or dry nitrogen which may be emitted through a plurality of holes or slots (not shown) in the surface of multi-laminar element, 10 which may be used to control the temperature of a part in close proximity to said holes or slots. Indeed, this flowing gas may even be used to generate Bernoulli forces to provide a gripping action to hold down a part, such as a semiconductor wafer which is to be processed. Alternately, the flowing gas may be used to provide for a bearing surface with virtually no friction. While the machined passages in core plate, 11 whether they be for acceptance of an electric heating element, 12 or for conveyance of fluids may be produced through conventional machining such as that accomplished by a vertical mill, they may also be produced by punching. The process of the instant invention is not limited to the previously described embodiment whereby multi-laminar element, 10 is produced only from core plate, 11 which is brazed between first and second outer plates, 14 and 15. Indeed, the core construction, which may itself consist of one or more elements, may be in the form of a plurality of punched sheets, of varying thickness, which may for example, be laminated together with suitable brazing alloy being interleaved between them. This laminated or "platelet" stack is then placed into the previously described pouch and processed as described above. If required, several layers may be produced with each layer having a unique pattern of passages which may or may not fluidly communicate between said layers. Additionally if a multi-laminar element, 10 exhibiting an extremely high modulus is desired, the core of such an element may contain any of the well known engineering sections or combinations of sections such as "I" or "H" or "U" shaped members where these members are fabricated from high tensile and/or high compression strength materials and are joined using the process of the instant invention.

If multi-laminar element, 10 is to be a heated plate which is to be used for radiatively transferring heat energy to substrates or other parts to be processed, it is highly desirable that whichever external surface(s) of multi-laminar element, 10 are to be the radiating portions of the assembly have a highly emissive surface. While the aforementioned braze alloys require thermal processes which are devoid of oxygen, such processes will, at elevated temperatures, cause the surfaces of stainless steel and many other metals to actually lose potentially beneficial emissivity, as any oxide layer present on these metals may be removed or diminished. Ideally, some form of coating is applied to the surface of the radiating portions of the assembly to increase surface emissivity. The instant invention provides for an economical means not only of brazing together the desired components but also provides for a simultaneous means of creating a highly emissive surface coating on the exterior planar surfaces of multi-laminar element, 10. By pulling a vacuum on evacuation tube, 30, the brazing process occurs in an environment free of oxygen and other contaminants, thereby permitting excellent braze joints to be produced. Because the pouch is its own vacuum chamber, the exterior of the pouch may be heated to the appropriate brazing temperature in an atmospheric oven. Use of an atmospheric oven permits not only the aforementioned brazing operation to be performed but also, simultaneously allows a controlled layer of oxide to be formed on the exterior of the pouch. This oxide layer is highly emissive and provides the desired degree of thermal radiation as may be required to thermally process semiconductor components or other materials. Formation of this oxide layer can be enhanced if the atmosphere surrounding first outer plate, 14 and second outer plate, 15 was, for example, humidified nitrogen gas. At the elevated temperatures of the process, said water vapor will dissociate and cause accelerated oxidation of materials to which it is exposed. If this oxide layer is to be formed on both exterior planar surfaces of the product of the process of the instant invention it is desirable to support first outer plate, 14 in such a manner that, while supporting outer plate, 14 evenly and entirely over its surface that this means of support permit the flow of atmosphere through it. While small pegs or a "bed of nails" could be used for this purpose, it has been found that an excellent method of providing for a breathable support is to place a piece of woven, fused quartz cloth on top of the furnace hearth and then place on this cloth the object to be processed. If for some reason a low emissivity surface is desired, the atmosphere surrounding first outer plate, 14 and second outer plate, 15 could be of such a nature that oxidation does not take place, for example an argon atmosphere.

After the brazing process is completed, a machine tool, such as a vertical mill is used to carefully machine away a portion of second outer plate, 15 in the general region of locator pin, 19. The mill is adjusted so that it cuts just through second outer plate, 15. Locator pin, 19 is visually detected during the machining process. Any number of hole and pin assemblies may be used to precisely locate core plate, 11, but at least two are preferred, with three being optimally preferred. Once the precise position of, locator pin(s), 19 is revealed, locator pin(s), 19 is removed by milling to once again reveal locator hole, 18. The resulting hole(s) through core plate, 11 may now be used as precise reference points by which to machine away that portion of first and second outer plates, 14 and 15 which extends past the peripheral edges of core plate, 11 as well as to machine away any excess filler alloy which may have accumulated in the vacuum distribution region bounded by first and second outer plates, 14 and 15 and the peripheral edge of core plate, 11. Locator holes, 18 could of course be drilled or otherwise formed in the edge of core plate, 11 so that said holes are orientated with their central axis normal to the edge of core plate, 11, but the previously described location is preferred. While graphite is the preferred material for locator pin, 19, other materials may be used. Indeed, if no pin is placed in locator hole, 18, it will fill with molten braze alloy which can also be located in similar fashion to the location of a graphite locator pin. However, since the alloy will have somewhat diffused into the surface of core plate, 11, it is difficult to locate the interface between the alloy and core plate, 11 precisely. At this time also, surplus outer plate material and surplus filler alloy around alignment/protector sleeves, 20 is machined away. Any additional machining such as through holes and the like is also accomplished at this time. When all machining operations are completed, the part will resemble that illustrated in FIG. 1.

Figure 7:
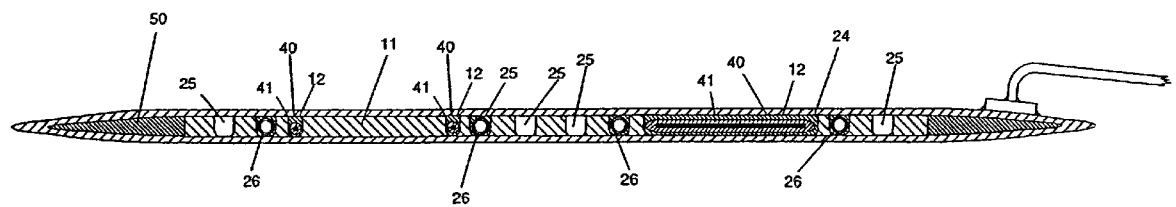
FIG. 7 is a section view of a multi-element assembly showing open fluid channels.

FIG. 7 shows yet another embodiment by way of a cross sectional view of the instant invention after brazing but before final machining. Braze alloy, 50 can be seen to have flowed completely around all materials contained in the aforementioned pouch. The inclusion of optional fluid channels, 25 through which channels may flow heating and or cooling fluids is illustrated in the form of a open channel. Perforations, not shown may be used for the communication of said fluids or, alternately, gasses such as helium or dry nitrogen to control the temperature of a part in close proximity to said holes or slots. Indeed, this flowing gas may even be used to generate Bernoulli forces to provide a gripping action to hold down a part, such as a semiconductor wafer which is to be processed. Alternately, the flowing gas may be used to provide for a bearing surface with virtually no friction. It is noted that the preferred placement for the evacuation tube, 60 is along the peripheral edge of the structure.

Figure 8:
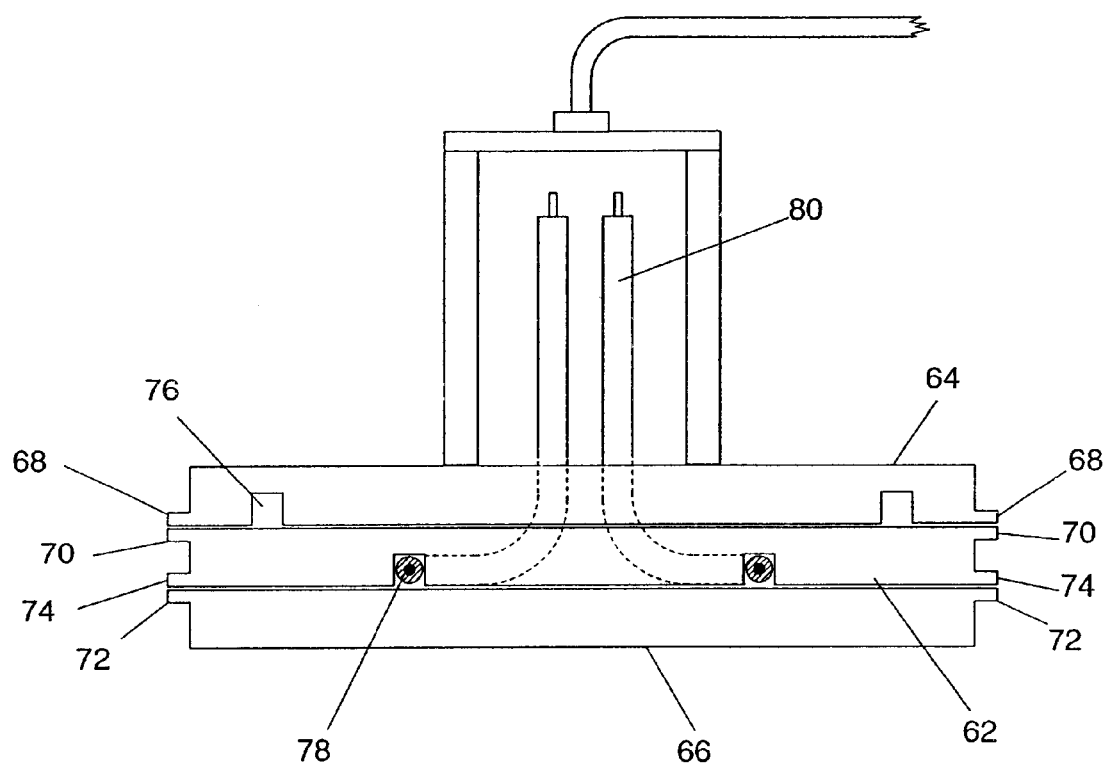
FIG. 8 is a sectional view of a multi-element assembly having a core equal in width to the outer plates.

FIG. 8 shows a cross sectional view of another embodiment of the instant invention before brazing. In this embodiment, the pouch is formed around a core plate 62 that is of equal size to the first plate 64 and second plate 66. The first plate include welding tip 68 which aligns with welding tip 70 of core plate 62. Similarly, welding tip 72 of second plate 66 aligns with welding tip 74 of core plate 62. Channels 76 allow the flow of heating and or cooling fluids. Machining passages 78 in the core plate 62 allow insertion of an electric heating elements 80. Vacuum may be drawn through housing structure 82 in accordance with the previous embodiments.

Therefore it can be seen that a new and highly useful assembly may be economically produced by utilizing a process which not only permits the use of low cost brazing alloys but also combines several beneficial manufacturing processes into a single, efficient process. By simultaneously combining the processes of component loading, bonding, alloy flow control, and if desired, surface oxidation into one thermal process considerable time and energy can be saved, thereby improving product throughput and reducing production costs. Additionally, the combinatorial manufacturing process described by the instant invention permits the manufacturer to exercise a high degree of control over the simplified process.

What is claimed is:

1. An apparatus for the precise thermal treatment of a material selected from the group consisting of sheets of glass, semiconductor substrates, chemical compounds and biological materials, comprising:

a first outer plate, a first braze alloy layer, a core construction having a first face adjacent said first outer plate and a second face adjacent a second outer plate and including heating or cooling means substantially positioned within a central plane located between said first face and said second face, a second braze alloy layer and said second outer plate in overlying relationship, said first outer plate, first braze alloy layer, second braze alloy layer and second outer plate being of a size which is peripherally larger than said core construction;

wherein said apparatus is formed by first edge welding said first outer plate and said second outer plate thereby forming a sealed pouch enclosing said core construction; subsequently attaching to one of said outer plates an evacuation tube in fluid communication with an interior area of said pouch; evacuating said interior area by fluidly coupling a source of vacuum to said evacuation tube; and furnace brazing said evacuated sealed pouch by heating to a temperature sufficient to liquify said brazing alloy within a controlled atmosphere furnace, wherein differential pressure creates a dynamic loading condition;

whereby a bonded unitary multi-laminar element containing substantially no voids between said elements is formed.

2. The apparatus in accordance with claim 1 wherein:
said core construction is a platelet stack including a plurality of sheets laminated together with suitable brazing alloy interleaved therebetween.

3. The apparatus in accordance with claim 1 wherein:
said first and second brazing alloys are selected from the group consisting of powdered metal alloys, binary alloys, ternary alloys, silver/copper eutectic alloys, and nickel/phosphorus eutectic alloys.

4. The apparatus in accordance with claim 1 wherein: said multi-laminar elements are flat.

5. The apparatus in accordance with claim 1 wherein: said heating or cooling means are passages for traversal of a heating or cooling fluid.

6. The apparatus in accordance with claim 1 wherein: said heating means are internal electric heating elements.

7. An apparatus for the precise thermal treatment of a material selected from the group consisting of sheets of glass, semiconductor substrates, chemical compounds and biological materials, comprising;

a first outer plate, a core construction having a first face adjacent said first outer plate and a second face adjacent a second outer plate and including heating or cooling means substantially positioned within a central plane located between said first face and said second face, and said second outer plate in overlying relationship, wherein said first outer plate and said second outer plate each have an abutting surface adjacent said core construction, each of said abutting surfaces containing a thin layer of a brazing alloy deposited thereon, and wherein said first and second outer plates are of a size which is peripherally larger than said core construction;

wherein said apparatus is formed by first edge welding said first outer plate and said second outer plate thereby forming a sealed pouch enclosing said core construction; subsequently attaching to one of said outer plates an evacuation tube in fluid communication with an interior area of said pouch; evacuating said interior area by fluidly coupling a sour e of vacuum to said evacuation tube; and furnace brazing said evacuated sealed pouch by heating to a temperature sufficient to liquify said brazing alloy within a controlled atmosphere furnace, wherein differential pressure creates a dynamic loading condition;

whereby a bonded unitary multi-laminar element containing substantially no voids between said elements is formed.

8. The apparatus in accordance with claim 7 wherein:
said core construction is a platelet stack including a plurality of sheets laminated together with suitable brazing alloy interleaved therebetween.

9. The apparatus in accordance with claim 7 wherein:
said brazing alloy is selected from the group consisting of powdered metal alloys, binary alloys, ternary alloys, silver/copper eutectic alloys, and nickel/phosphorus eutectic alloys.

10. The apparatus in accordance with claim 7 wherein: said multi-laminar elements are flat.

11. The apparatus in accordance with claim 7 wherein: said heating or cooling means are passages for traversal of a heating or cooling fluid.

12. The apparatus in accordance with claim 7 wherein: said heating means are internal electric heating elements.

13. An apparatus for the precise thermal treatment of a material selected from the group consisting of sheets of glass, semiconductor substrates, chemical compounds and biological materials comprising:

positioning a first outer plate, a core construction having a first face adjacent said first outer plate and a second face adjacent a second outer plate and including heating or cooling means substantially positioned within a central plane located between said first face and said second face, and said second outer plate in overlying relationship, wherein said core construction first face and second face each respectively define first and second abutting surfaces adjacent said first outer plate and said second outer plate respectively, each of said abutting surfaces containing a thin layer of a brazing alloy deposited thereon, and wherein said first and second outer plates are of a size which is peripherally larger than said core construction;

wherein said apparatus is formed by first edge welding said first outer plate and said second outer plate thereby forming a sealed pouch enclosing said core construction; subsequently attaching to one of said outer plates an evacuation tube in fluid communication with an interior area of said pouch; evacuating said interior area by fluidly coupling a source of vacuum to said evacuation tube; and furnace brazing said evacuated sealed pouch by heating to a temperature sufficient to liquify said brazing alloy within a controlled atmosphere furnace, wherein differential pressure creates a dynamic loading condition;

whereby a bonded unitary multi-laminar element containing substantially no voids between said elements is formed.

14. The apparatus in accordance with claim 13 wherein:
said core construction is a platelet stack including a plurality of sheets laminated together with suitable brazing alloy interleaved therebetween.

15. The apparatus in accordance with claim 13 wherein:
said brazing alloy is selected from the group consisting of powdered metal alloys, binary alloys, ternary alloys, silver/copper eutectic alloys, and nickel/phosphorus eutectic alloys.

16. The apparatus in accordance with claim 13 wherein: said multi-laminar elements are flat.

17. The apparatus in accordance with claim 13 wherein: said heating or cooling means are passages for traversal of a heating or cooling fluid.

18. The apparatus in accordance with claim 13 wherein: said heating means are internal electric heating elements.

19. A multi-laminar apparatus having high thermal conductivity throughout its surface for the precise thermal treatment of a substrate, said apparatus comprising a core having a periphery and first and second planar surfaces with central passages in said planar surfaces, electric heating means seated in said passages for providing a thermal heat source, a first outer plate having an inner surface larger than said first planar surface of said core, said inner surface of said first outer plate in contact with said first surface of said core throughout said first surface of said core, a second outer plate having an inner surface larger than said second planar surface of said core, said inner surface of said second outer plate in contact with said second surface of said core throughout said second surface of said core, said larger inner surface of said first outer plate and said larger inner surface of said second outer plate in contact with each other outside said first and second surfaces of said core, said first and second surfaces of said core and said first inner surface of said first outer plate and said inner surface of said second outer plate being brazed together throughout the area of contact, said larger inner surface of said first outer plate and said larger inner surface of said second outer plate being brazed together throughout the area of contact, a portion of said electric heating means fixed in said passages by said brazing.

20. A multi-laminar apparatus of claim 19 wherein said first outer plate has a periphery, said second outer plate has a periphery, said periphery of said first outer plate, said second outer plate and said core are welded together.

21. A multi-laminar apparatus of claim 19 wherein said core includes tubular channel means for introducing heating or cooling fluids.

* * * * *